(12) United States Patent
Lin

(10) Patent No.: US 11,189,336 B2
(45) Date of Patent: Nov. 30, 2021

(54) WORD LINE DRIVING DEVICE FOR MINIMIZING RC DELAY

(71) Applicant: Taiwan Semiconductor Manufacturing Co., Ltd., Hsinchu (TW)

(72) Inventor: Ku-Feng Lin, New Taipei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/878,594

(22) Filed: May 19, 2020

(65) Prior Publication Data
US 2021/0134352 A1    May 6, 2021

Related U.S. Application Data

(60) Provisional application No. 62/927,695, filed on Oct. 30, 2019.

(51) Int. Cl.
| | |
|---|---|
| *G11C 11/408* | (2006.01) |
| *G11C 11/4074* | (2006.01) |
| *G11C 11/4063* | (2006.01) |
| *G11C 5/06* | (2006.01) |
| *G11C 8/08* | (2006.01) |
| *G11C 8/14* | (2006.01) |
| *G11C 11/16* | (2006.01) |
| *G11C 13/00* | (2006.01) |

(52) U.S. Cl.
CPC .......... *G11C 11/4085* (2013.01); *G11C 5/063* (2013.01); *G11C 8/08* (2013.01); *G11C 8/14* (2013.01); *G11C 11/1657* (2013.01); *G11C 11/4063* (2013.01); *G11C 11/4074* (2013.01); *G11C 13/0028* (2013.01)

(58) Field of Classification Search
CPC ......... G11C 11/4085; G11C 8/14; G11C 8/08; G11C 5/063; G11C 11/4074; G11C 11/4063

See application file for complete search history.

(56) References Cited

U.S. PATENT DOCUMENTS

| | | | | |
|---|---|---|---|---|
| 5,875,149 A | * | 2/1999 | Oh ........................... | G11C 8/14 365/230.06 |
| 5,933,387 A | * | 8/1999 | Worley .................... | G11C 8/12 365/230.03 |
| 5,940,315 A | * | 8/1999 | Cowles ................... | G11C 5/063 365/51 |

(Continued)

*Primary Examiner* — Mushfique Siddique
(74) *Attorney, Agent, or Firm* — JCIPRNET

(57) ABSTRACT

A word line driving device of a memory device is provided. The word line driving device of the memory device includes a word line, a word line driver, and a conducting line. The word line is disposed on a first metal layer. The word line is connected to a plurality of memory cells in a memory array. The word line driver is coupled to a first node of the word line. The conducting line is disposed on a second metal layer. The first node of the word line is coupled to a first node of the conducting line and a second node of the word line is coupled to a second node of the conducting line. The distance of the second metal layer with respect to a plurality of transistors in the memory device is greater than a distance of the first metal layer with respect to the plurality of transistors in the memory device.

20 Claims, 8 Drawing Sheets

(56) References Cited

U.S. PATENT DOCUMENTS

| | | | | |
|---|---|---|---|---|
| 6,144,610 | A * | 11/2000 | Zheng | G11C 8/08 |
| | | | | 365/203 |
| 10,658,028 | B2 * | 5/2020 | Ishii | G11C 5/063 |
| 2002/0153545 | A1 * | 10/2002 | Tomishima | G11C 5/063 |
| | | | | 257/296 |
| 2012/0037997 | A1 * | 2/2012 | Chen | H01L 21/82385 |
| | | | | 257/369 |
| 2016/0155484 | A1 * | 6/2016 | Lin | G11C 8/10 |
| | | | | 365/230.03 |

* cited by examiner

WORD LINE DRIVING DEVICE FOR MINIMIZING RC DELAY

CROSS-REFERENCE TO RELATED APPLICATION

This application claims the priority benefit of U.S. provisional applications Ser. No. 62/927,695, filed on Oct. 30, 2019. The entirety of the above-mentioned patent application is hereby incorporated by reference herein and made a part of this specification.

BACKGROUND

In a memory device, a word line may be coupled to a plurality of memory cells in a memory array. Each of the memory cells are coupled by a corresponding bit lines BLs. As the plurality of memory cells are coupled with the word line, a wire length of the word line may be long, which results in the word line has a higher parasitic resistance and capacitance, that is RC delay of the word line is high. When the word line is selected to charge a plurality of transistors coupled to each of the memory cells, it may take more time to charge all the transistors in due to higher parasitic resistance and capacitance in the word line.

Therefore, there is a need to design a word line driving device in the memory device with minimum RC delay.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1A:
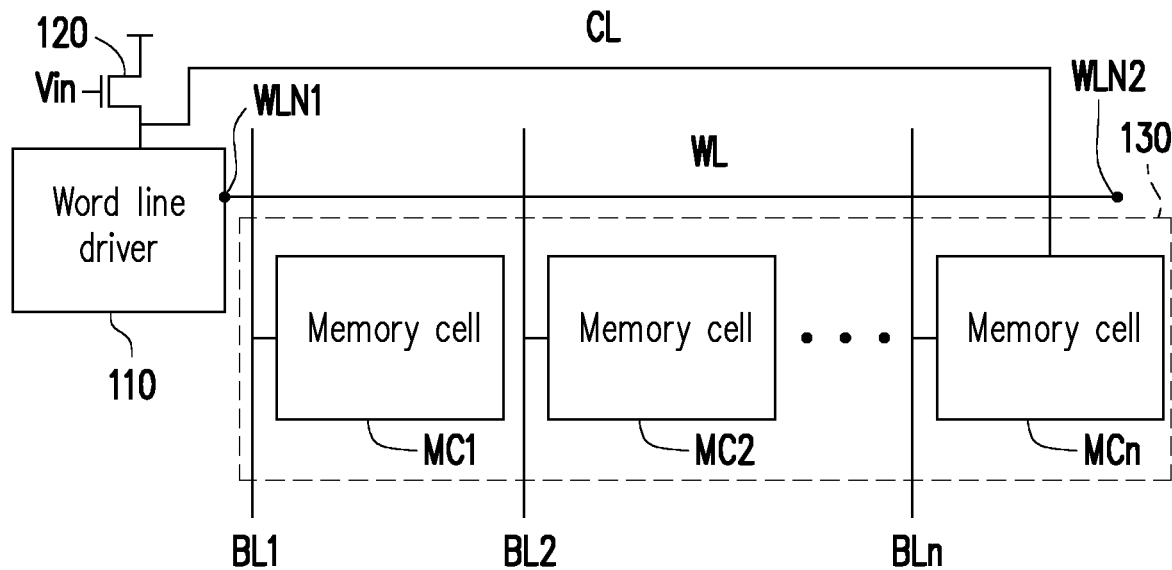
FIG. 1A illustrates a block diagram of a word line driving device of a memory device according to an exemplary embodiment of the disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A illustrates a block diagram of a word line driving device of a memory device according to an exemplary embodiment of the disclosure. The word line driving device of the memory device 100 includes a word line driver 110, a power transistor 120 and a plurality of memory cells 130. The word line driver 110 is configured to drive the plurality of memory cells 130 in a memory array of the memory device 100. The memory cells 130 are coupled to the word line driver 110 through a word line WL.

In one embodiment, the number of the memory cells 130 coupled to the word line WL is n, that is the memory cells 130 includes a memory cell MC1 to a memory cell MCn, where n is a positive integer value. For an example, the memory cells MC1, MC2, and MCn are illustrated in FIG. 1A.

In some embodiments, the number of memory cells 130 coupled to the word line WL is 1152. To be specific, the memory cells 130 includes a memory cell MCI (i.e., n=1) to a memory cell MC1152 (i.e., n=1152). The number of memory cells 130 is not limited in this disclosure.

In one example, the word line WL includes a front node WLN1 (i.e., a first node) of the word line WL and an end node WLN2 (i.e., a second node) of the word line WL, and a conducting line CL is disposed between the front node WLN1 and the end node WLN2 of the word line WL. It is noted that an equivalent resistance of the conducting line CL is less than an equivalent resistance of the word line WL. The front node WLN1 of the word line WL is located at the memory cell MC1 or near to the memory cell MC1 and the end node WLN2 of the word line WL is located at the memory cell MC1152 or near to the memory cell MC1152. The word line WL is connected to the plurality of memory cells in the memory array. For an example, one row of the memory cells of the memory array are connected to one word line WL of a plurality of word line WLs in the memory device.

Each of the memory cells 130 are coupled with the word line WL and the corresponding bit lines BLs. In detail, a bit line corresponding to the memory cell MC1 is a bit line BL1 and a bit line corresponding to the memory cell MCn is a bit line BLn.

The power transistor 120 is a CMOS transistor. The power transistor 120 includes a source terminal, a drain terminal, and a control terminal. The source terminal is coupled to a power supply of the memory device 100. The control terminal is coupled to the input terminal. In detail, the control of the power transistor 120 is configured to receive an input Vin to enable the word line driver 110. The drain terminal is coupled to the word line driver 110.

Figure 1B:
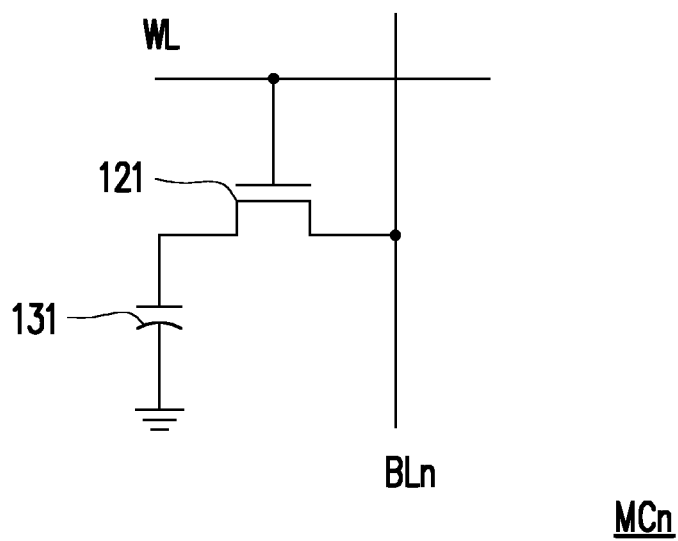
FIG. 1B illustrates a memory cell in a memory device according to an exemplary embodiment of the disclosure.

FIG. 1B illustrates a memory cell in a memory device according to an exemplary embodiment of the disclosure. With reference to FIG. 1B, one memory cell MCn of the memory cells 130 includes an access transistor 121 and a capacitor 131. The access transistor 131 is a CMOS transistor.

In one embodiment, the access transistor 131 is a N-type transistor.

In some embodiments, the access transistor 131 is a P-type transistor, thus the type of access transistor 131 is not limited in this disclosure.

Referring to FIG. 1A, the power transistor 120 provides a system power to the word line driver 110. In this embodiment, the power transistor 120 is a PMOS transistor. The power transistor 120 includes a source terminal, a drain terminal, and a control terminal. The source terminal is coupled to a power supply VDD, the drain terminal is coupled to the word line driver 110 and the control terminal receives a control signal Vin to turn on the power transistor 120.

By using the conducting line with low equivalent resistance is coupled between the front node and the end node of the word line, the word line may be charged from both a near side and a far side of the word line. by the word line driver, thereby reducing a RC delay of the memory device and a reading time of the memory device is correspondingly reduced.

Figure 2:
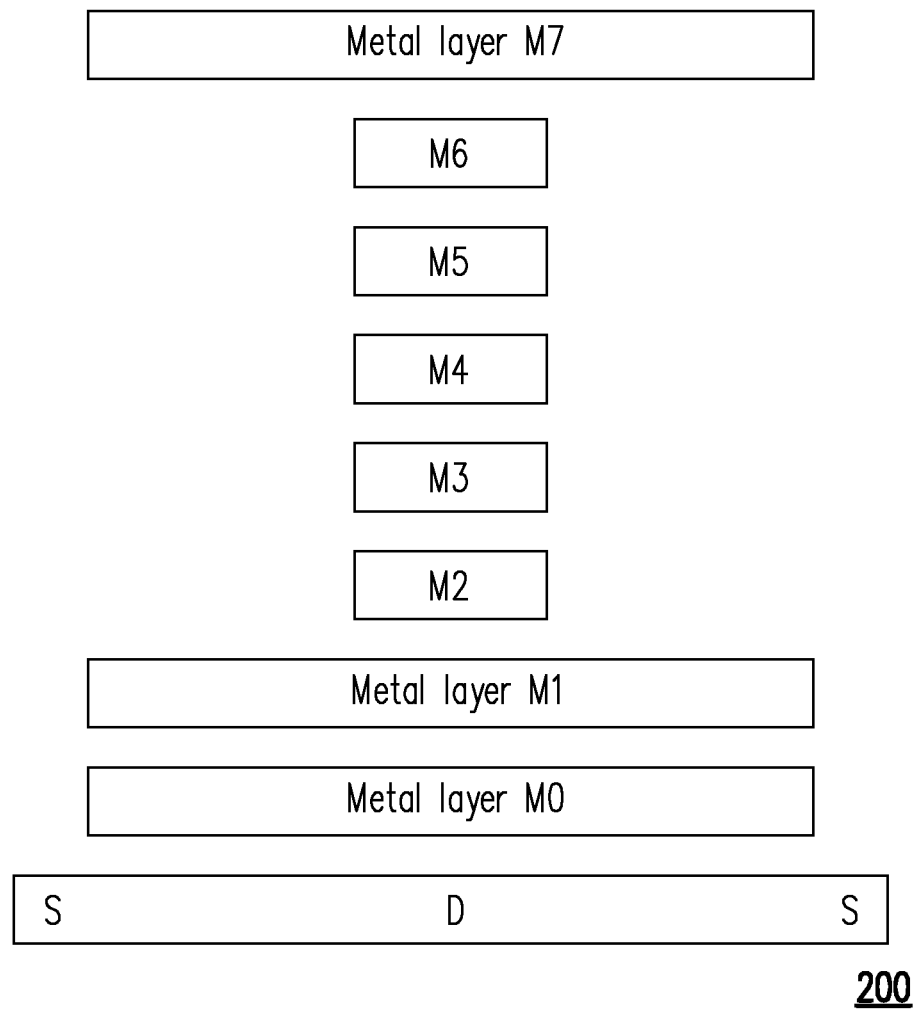
FIG. 2 illustrates a cross-sectional view of a memory device according to an exemplary embodiment of the disclosure.

FIG. 2 illustrates a cross-sectional view of a memory device according to an exemplary embodiment of the disclosure. The memory device 200 includes a plurality metal layers. In detail, the plurality of metal layers includes the metal layers M0~M6.

In the memory device, the metal layer M0 to M4 are isolated metal layers. It is noted that the isolated metal layers are used to isolate the metals from each other.

With reference to FIG. 1A, FIG. 1B and FIG. 2, a plurality of bit lines BLs is disposed on the metal layer M6, a word line WL is disposed on the metal layer M1, and a conducting line CL is disposed on the metal layer M7. Thus, the word line WL on the metal layer M1 may not easily interfere with the conducting line CL on the metal layer M7.

The metal layer M1 and the metal layer M7 are connected through a plurality of vias or a plurality of pads. It is noted that, a distance of the metal layer M7 with respect to a plurality of transistors in the memory device 200 is greater than a distance of the metal layer M1 with respect the plurality of transistors in the memory device 200. As the memory cells are not directly connected to the metal layer M7, an equivalent resistance with the conducting line CL of the metal layer M7, is also known as a parasitic resistance of the metal layer M7, is less compared to an equivalent resistance of the metal layer M1.

Figure 3:
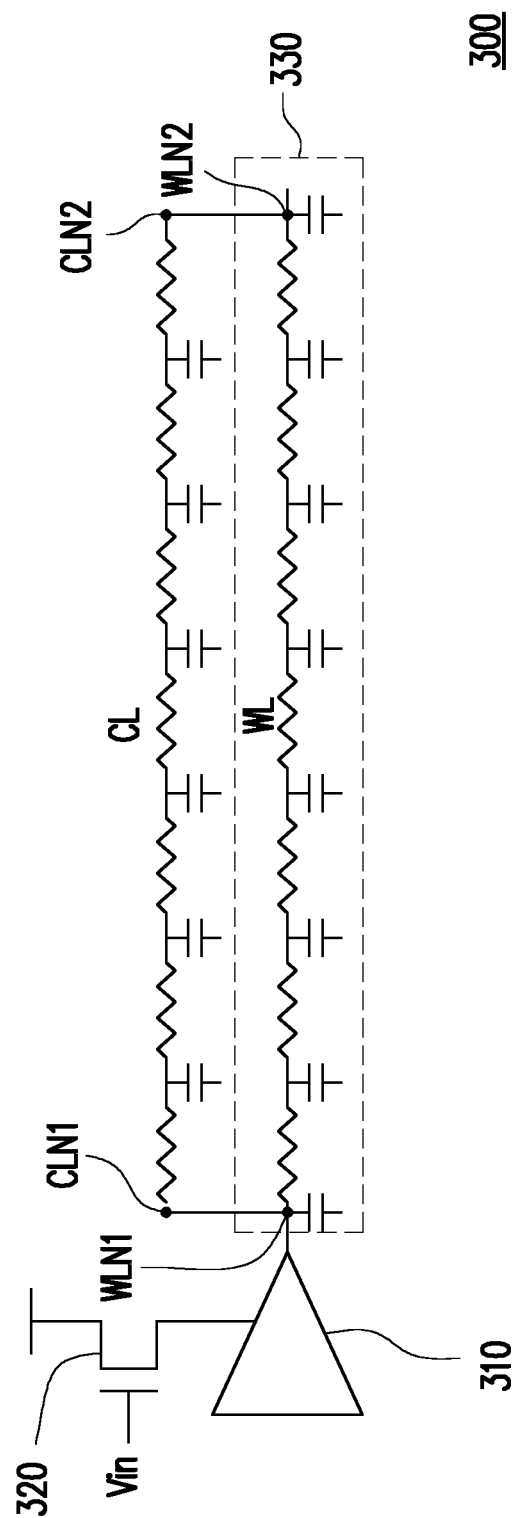
FIG. 3 illustrates a schematic of a word line driving device of a memory device according to an exemplary embodiment of the disclosure.

FIG. 3 illustrates a schematic of word line driving device of a memory device according to an exemplary embodiment of the disclosure. The word line driving device of the memory device 300 includes a word line driver 310, a power transistor 320, and a plurality of memory cells 330.

With reference to FIG. 1A, FIG. 1B and FIG. 3, the word line driver 310, the power transistor 320, and the memory cells 330 are respectively similar to a word line driver 110, a power transistor 120, and a plurality of memory cells 130. FIG. 3 uses the marks of capacitance to present the locations of the memory cells 330.

The word line driver 310 is configured to drive the memory cells 330 in a memory array of the memory device 300. The memory cells 330 are coupled to the word line driver 310 through a word line WL. The number of the memory cells 330 coupled to the word line WL is 1152.

With reference to FIG. 1A and FIG. 3, the word line drivers 310 includes a front node (i.e., a first node) of the word line WL and an end node WLN2 (i.e., a second node) of the word line WL, and a conducting line CL is disposed between the front node WLN1 and the end node WLN2. The front node WLN1 of the word line WL is located at a memory cell MC1 or near to the memory cell MC1 and the end node WLN2 of the word line WL is located at a memory cell MC1152 or near to the memory cell MC1152.

With reference to FIG. 3, the word line WL is disposed on a first metal layer of the memory device 200 and a conducting line CL is disposed on a second metal layer of the memory device 200. The conducting line CL includes a front node CLN1 and an end node CLN2. It is noted that the front node CLN1 of the conducting line CL is coupled to the front node WLN1 of the word line WL. Similarly, the end node CLN2 of the conducting line CL is coupled to the end node WLN2 of the word line WL.

With reference to FIG. 2 and FIG. 3, a plurality of bit lines BLs is disposed on a metal layer M6, the word line WL of FIG. 3 is disposed on a metal layer M1 of FIG. 2, and the conducting line CL of FIG. 3 is disposed on a metal layer M7 of FIG. 2.

The first metal layer in the memory device is a metal layer M1 in a semiconductor process and the second metal layer in the memory device is a metal layer M7 in the semiconductor process. It is noted that, a distance of the second metal layer with respect to a plurality of transistors in the memory device is greater than a distance of the first metal layer with respect to the plurality of transistors in the memory device.

Each of the memory cells 330 are coupled with the word line WL and the corresponding bit lines BLs. It is noted that, the front node WLN1 of the word line WL driven by the word line driver 310.

By using the conducting line with low equivalent resistance is coupled between the front node and the end node of the word line, the word line may be charged from both a near side and a far side of the word line WL by the word line driver, thereby reducing the RC delay of the memory device and a reading time of the memory device is correspondingly.

Figure 4:
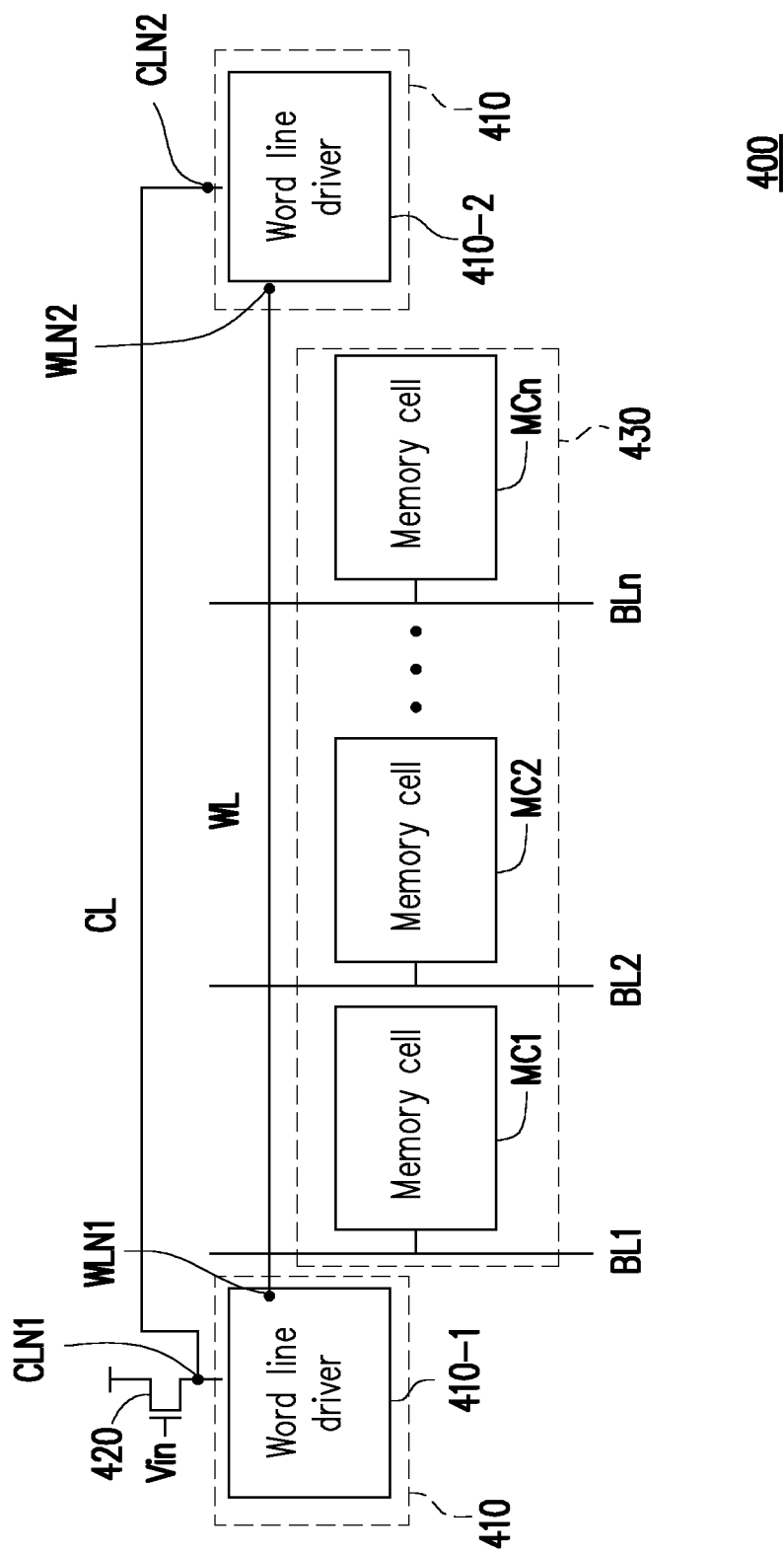
FIG. 4 illustrates a block diagram of a word line driving device of a memory device according to an exemplary embodiment of the disclosure.

FIG. 4 illustrates a block diagram of a word line driving device of a memory device according to an exemplary embodiment of the disclosure. The word line driving device of the memory device 400 includes a plurality of word line drivers 410, a power transistor 420 and a plurality of memory cells 430.

The word line drivers 410 includes a word line driver 410-1 and a word line driver 410-2. The word line drivers 410 are configured to drive the plurality of memory cells 430 in a memory array of the memory device 400. The memory cells 430 are coupled to the word line drivers 410 through a word line WL.

In one embodiment, the number of the memory cells 430 coupled to the word line WL is n, where n is a positive integer value.

In some embodiments, the number of the memory cells 430 coupled to the word lines WL is 1152. To be specific, the memory cells 430 includes a memory cell MC1 (i.e., n=1) to a memory cell MC1152 (i.e., n=1152).

The word line WL includes a front node WLN1 (i.e., first node) of the word line WL1 and an end node WLN2 (i.e., a second node) of the word line WL.

The word line driver 410-1 is coupled to the front node WLN1 of the word line WL and the word line driver 410-2 is coupled to the end node WLN2 of the word line WL. The word line driver 410-1 and the word line driver 410-2 drives the word line WL simultaneously.

Similarly, a front node CLN1 of the conducting line CL is coupled to the word line driver 410-1 and an end node CLN2 of the conducting line CL is coupled to the word line driver 410-2. It is noted that the front node CLN1 of the conducting line CL is coupled to the front node WLN1 of the word line WL. Similarly, the end node CLN2 of the conducting line CL is coupled to the end node WLN2 of the word line WL.

The front node WLN1 of the word line WL is located at a memory cell MC1 or near to the memory cell MC1 among the plurality of memory cells 430 and the end node WLN2 of the word line WL is located at a memory cell MC1152 or near to the memory cell MC1152 among the plurality of memory cells 430. Each of the memory cells 430 are coupled with a word line WL and the corresponding bit lines BLs. In other words, a bit line corresponding to the memory cell MC1 is a bit line BL1 and a bit line corresponding to the memory cell MCn is a bit line BLn.

In the embodiment, the power transistor 420 is a CMOS transistor. The power transistor 420 includes a source terminal, a drain terminal, and a control terminal. The source terminal is coupled to a power supply of the memory device 400. The control terminal is coupled to the input terminal. In detail, the control of the power transistor 420 is configured to receive an input Vin to enable the word line driver 410. The drain terminal is coupled to the word line driver 410-1 and the word line driver 410-2. To be specific, the drain terminal of the power transistor 420 is coupled to the front node CLN1 of the conducting line CL.

With reference to FIG. 1B and FIG. 4, one memory cell MCn of the memory cells 430 includes an access transistor 121 and a capacitor 131. The access transistor 131 is a CMOS transistor.

By using the plurality of word line drivers connected to both sides of the word line and the conducting line, the word line may be charged from both a near side and a far side of the word line, thereby a RC delay is further reduced.

Figure 5:
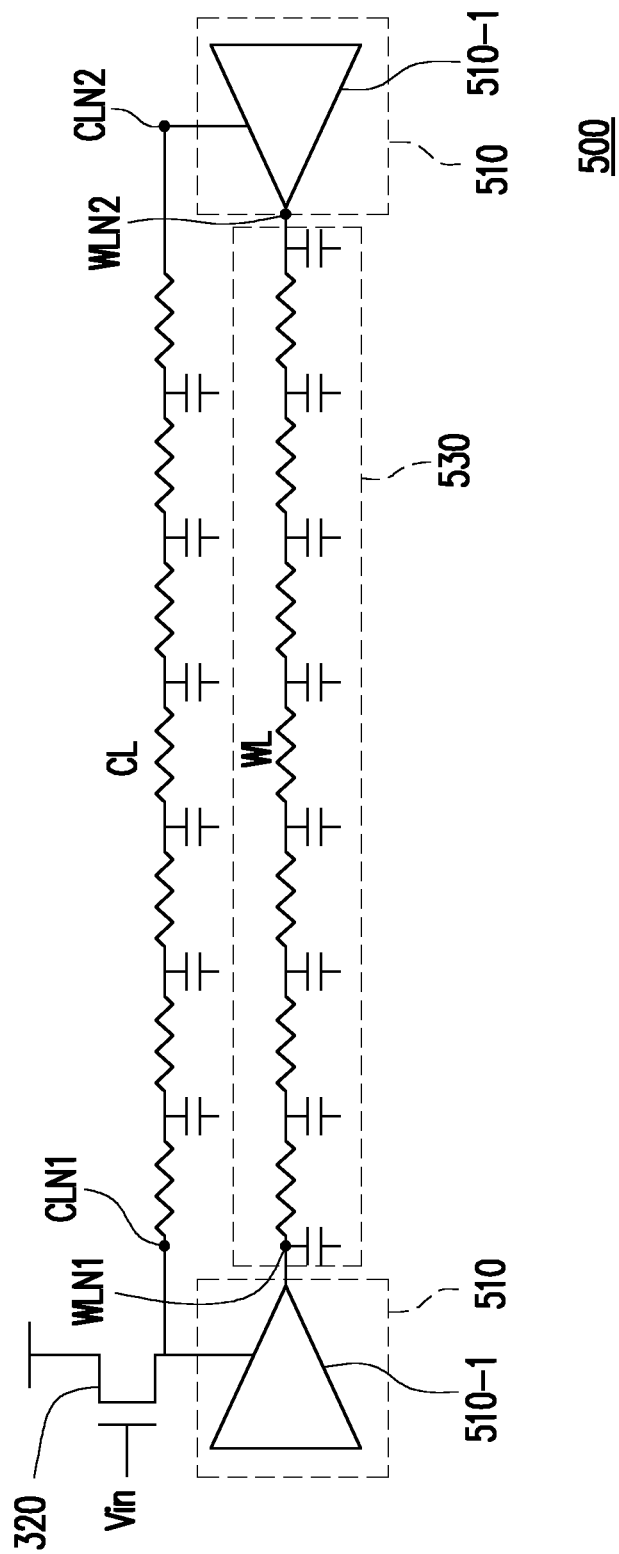
FIG. 5 illustrates a schematic of a word line driving device of a memory device according to an exemplary embodiment of the disclosure.

FIG. 5 illustrates a schematic of word line driving device of a memory device according to an exemplary embodiment of the disclosure. The word line driving device of the memory device 500 includes a plurality of word line drivers 510, a power transistor 520, and a plurality of memory cells 530.

With reference to FIG. 4, FIG. 5 and FIG. 1B, the word line drivers 510, the power transistor 520, and the memory cells 530 are respectively similar to a plurality of word line drivers 410, a power transistor 420, and a plurality of memory cells 430.

The word line drivers 510 includes a word line driver 510-1 and a word line driver 510-2. The word line drivers 510 is configured to drive the memory cells 530 in a memory array of the memory device 500. The memory cells 530 are coupled to the word line drivers 510 through a word line WL. The number of the memory cells 530 coupled to the word line WL is 1152.

With reference to FIG. 4 and FIG. 5, the word line drivers 510 includes a front node WLN1 (i.e., a first node) of the word line WL and an end node WLN2 (i.e., a second node) of the word line WL, and a conducting CL is disposed between the front node WLN1 and the end node WLN2. The front node WLN1 of the word line WL is located at a memory cell MC1 or near to the memory cell MC1 and the end node WLN2 of the word line WL is located at a memory cell MC1152 or near to the memory cell MC1152.

With reference to FIG. 3 and FIG. 5, the word line WL of FIG. 5 is disposed on a first metal layer of the memory device 500 and a conducting line CL of FIG. 5 is disposed on a second metal layer of the memory device 500. The conducting line CL includes a front node CLN1 and an end node CLN2. It is noted that the front node CLN1 of the conducting line CL is nearly coupled to the front node WLN1 of the word line WL through the word line driver 510-1. Similarly, the end node CLN2 of the conducting line CL is nearly coupled to the end node WLN2 of the word line WL through the word line driver 510-2.

With reference to FIG. 2 and FIG. 5, a plurality of bit lines BLs are disposed on a metal layer M6, the word line WL of FIG. 5 is disposed on a metal layer M1 of FIG. 2, and the conducting line CL of FIG. 5 is disposed on a metal layer M7 of FIG. 2.

The word line driver 510-1 is coupled to the front node WLN1 of the word line WL and the word line driver 510-2 is coupled to the end node of the word line WL. The word line driver 510-1 and the word line driver 510-2 drives the word line WL simultaneously.

Similarly, a front node CLN1 of the conducting line CL is coupled to the word line driver 510-1 and an end node CLN2 of the conducting line CL is coupled to the word line driver 510-2. It is noted that the front node CLN1 of the conducting line CL is coupled to the front node WLN1 of the word line WL. Similarly, the end node CLN2 of the conducting line CL is coupled to the end node WLN2 of the word line WL.

The front node WLN1 of the word line WL is located at a memory cell MC1 or near to the memory cell MC1 and the end node WLN2 of the word line WL is located at a memory cell MC1152 or near to the memory cell MC1152.

The power transistor 520 is a CMOS transistor. The power transistor 520 includes a source terminal, a drain terminal, and a control terminal. The source terminal is coupled to a power supply of the memory device 500. The control terminal is coupled to the input terminal. In detail, the control of the power transistor 520 is configured to receive an input Vin to enable the word line driver 510. The drain terminal is coupled to the word line driver 510-1. To be specific, the drain terminal of the power transistor 520 is coupled to the front node CLN1 of the conducting line CL.

The first metal layer in the memory device is the metal layer M1 in a semiconductor process and the second metal layer in the memory device is the metal layer M7 in the semiconductor process.

It is noted that, a distance of the second metal layer with respect to a plurality of transistors in the memory device is greater than a distance of the first metal layer with respect to the plurality of transistors in the memory device.

By using the plurality of word line drivers connected to both sides of the word line and the conducting line, the word line may be charged from both a near side and a far side by the word line driver, thereby a RC delay is further reduced in the memory device.

Figure 6:
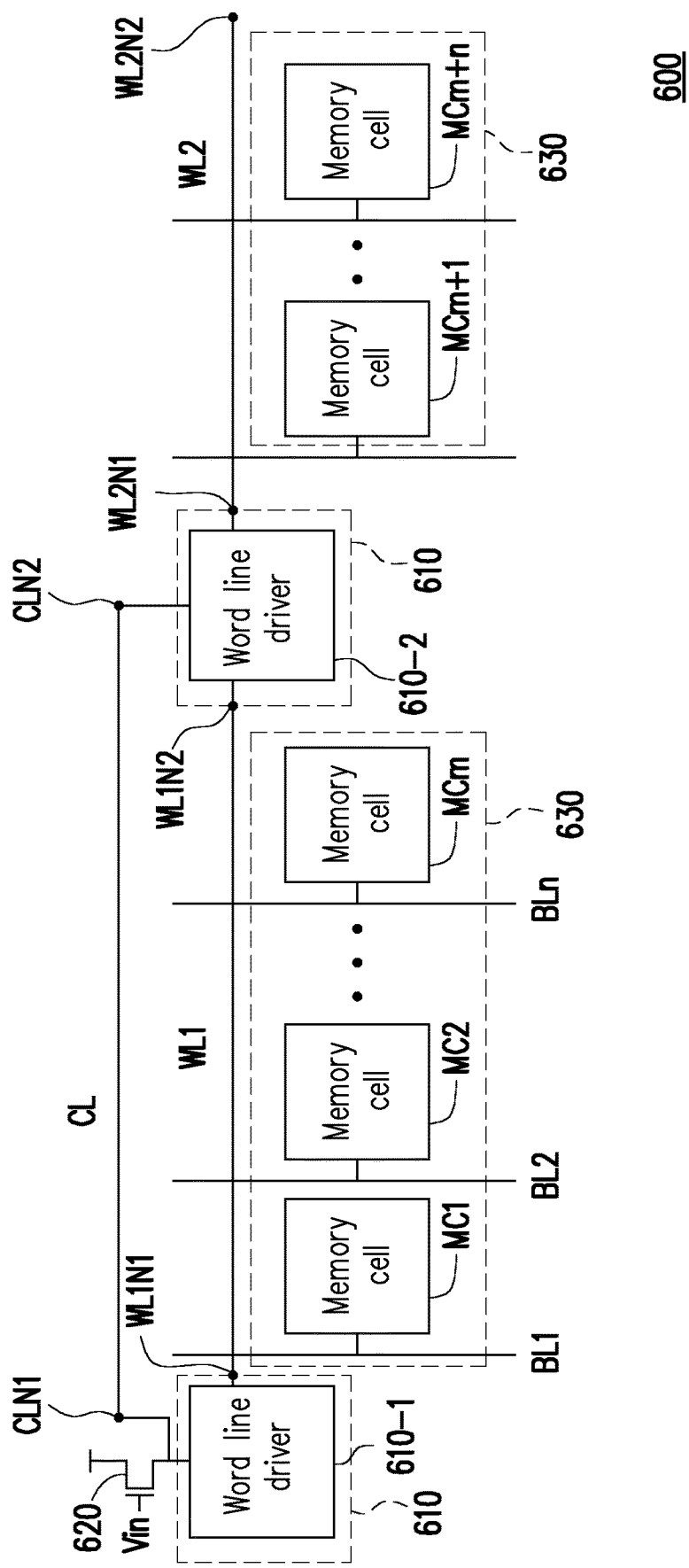
FIG. 6 illustrates a block diagram of a word line driving device of a memory device according to an exemplary embodiment of the disclosure.

FIG. 6 illustrates a block diagram of a word line driving device of a memory device according to an exemplary embodiment of the disclosure. The word line driving device of the memory device 600 includes a plurality of word line drivers 610, a power transistor 620 and a plurality of memory cells 630.

The word line drivers 610 includes a word line driver 610-1 and a word line driver 610-2. The word line drivers 610 are configured to drive the plurality of memory cells 630 in a memory array of the memory device 600. The memory cells 630 are coupled to the word line drivers 610 through a plurality of word lines WLs.

In one embodiment, the number of the memory cells 630 coupled to the word lines WLs is m and n, where one of m and n is a positive integer value.

In some embodiments, the number of the memory cells 630 coupled to the word lines WLs is 1152. The word lines WLs includes a word line WL1 and a word line WL2. The word line WL1 includes a front node WL1N1 and an end node WL1N2. Similarly, the word line WL2 includes a front node WL2N1 and an end node WL2N2. To be specific, the n number of memory cells 630 is coupled to the word line WL1 and m number of memory cells 630 is coupled to the word line WL2.

The conducting CL includes a front node CLN1 and an end node CLN2. The front node CLN1 of the conducting line CL is coupled to the word line driver 610-1 and the end node CLN2 of the conducting line CL is coupled to the word line driver 610-2. It is noted that the front node CLN1 of the conducting CL is nearly coupled to the front node WL1N1 of the word line WL2 through the word line driver 610-1. Similarly, the end node CLN2 of the conducting line CL is nearly coupled to the end node WL1N2 of the word line WL1 through the word line driver 610-2. In other words, the word line WL1 is coupled to a first half of the plurality of memory cells 630 in the memory array. The word line WL2 is coupled to a last half of the memory cells 630 in the memory array.

The word line driver 610-1 is coupled to the front node WL1N1 of the word line WL1. The word line driver 610-2 is coupled between the end node WL1N2 of the word line WL1 and the front node WL2N2 of the word line WL2.

In some embodiments, the front node WL1N1 of the word line WL1 is located at different memory cell among the plurality of memory cells 630 and the end node WL1N2 of the word line WL1 is located at a memory cell MCm among the plurality of memory cells 630. Similarly, the front node WL2N1 of the word line WL2 is located at a memory cell MCm+1 among the plurality of memory cells 630 and the end node WL2N2 of the word line WL2 is located at a memory cell MCm+n, where m and n are the positive integer values. Thus, the connection configuration of the word lines WLs corresponding to the memory cells 630 are not limited in this disclosure.

With reference to FIG. 1B, one memory cell MCn and the one memory cell MCm of the memory cells 630 includes an access transistor 121 and a capacitor 131. The access transistor 131 is a CMOS transistor.

The power transistor 620 is a CMOS transistor. The power transistor 620 includes a source terminal, a drain terminal, and a control terminal. The source terminal is coupled to a power supply of the memory device 600. The control terminal is coupled to the input terminal. In detail, the control of the power transistor 620 is configured to receive an input Vin to enable the word line driver 610. The drain terminal is coupled to the word line driver 610-1 and the word line driver 610-2. To be specific, the drain terminal of the power transistor 620 is coupled to the front node CLN1 of the conducting line CL.

By using plurality of word line drivers disposed in the middle of the memory cells and the conducting line disposed on the second metal layer connects both the word line drivers and provides the system power to both the word line drivers. Therefore, the word line WL1 may be charged from both a near end and a far end by the word line driver 610-1 and the other half of the word line, the word line WL2 may be charged by word line driver 610-2 in the memory device, thereby a RC delay of the memory device is further reduced.

Figure 7:
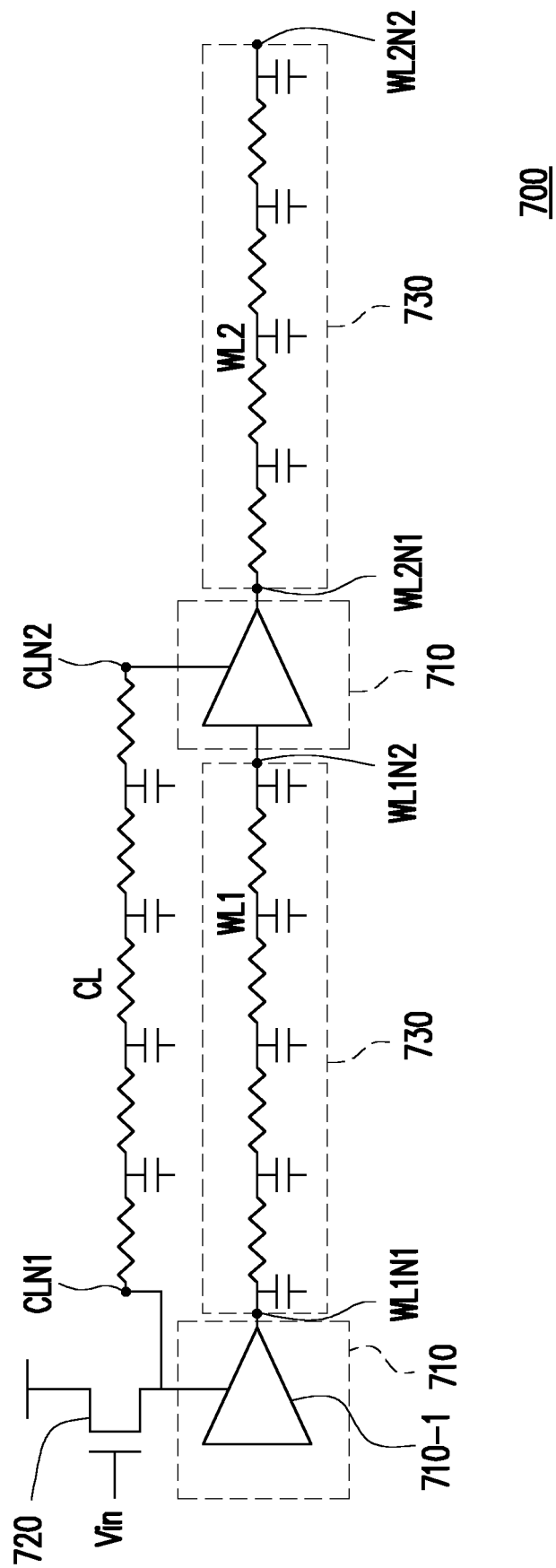
FIG. 7 illustrates a schematic of a word line driving device of a memory device according to an exemplary embodiment of the disclosure.

FIG. 7 illustrates a schematic of word line driving device of a memory device according to an exemplary embodiment of the disclosure. The word line driving device of the memory device 700 includes a plurality of word line drivers 710, a power transistor 720, and a plurality of memory cells 730.

With reference to FIG. 7 and FIG. 1B, the word line drivers 710, the power transistor 720, and the memory cells 730 are respectively similar to a plurality of word line drivers 610, a power transistor 620, and a plurality of memory cells 630.

The memory cells 730 includes a first half of the memory cells 730-1 and second half of the memory cells 730-2, is also known as last half of the memory cells.

The word line drivers 710 includes a word line driver 710-1 and a word line driver 710-2. The word line drivers 710 are configured to drive the plurality of memory cells 730 in a memory array of the memory device 700. The memory cells 730 are coupled to the word line drivers 710 through a plurality of word lines WLs. The number of the memory cells 730 coupled to the word lines WLs is 1152. The word line driver 710-1 is connected to the first half of the memory cells 730-1 and the word line driver 710-2 is connected to the second half of the memory cells 730-2.

The word lines WLs includes a word line WL1 and a word line WL2. The word line WL1 includes a front node WL1N1 and an end node WL1N2. Similarly, the word line WL2 includes a front node WL2N1 and an end node WL2N2. To be specific, the n number of the memory cells 730 is coupled to the word line WL1 and m number of the memory cells 730 is coupled to the word line WL2.

The word line WL1 is coupled to a first half of the plurality of memory cells 730 in the memory array. The word line WL2 is coupled to a last half of the memory cells 730 in the memory array.

The word line driver 710-1 is coupled to the front node WL1N1 of the word line WL1. The word line driver 710-2 is coupled between the end node WL1N2 of the word line WL1 and the front node of the word line WL2.

The number of the memory cells 730 coupled to the word lines WLs is 1152. The front node WL1N1 of the word line WL1 is coupled to a memory cell MC1 and the end node WL1N2 of the word line WL1 is coupled to the memory cell MC 578. Similarly, the front node WL2N1 of the word line WL2 is coupled to a memory cell MC577 and the end node WL2N2 of the word line WL2 is coupled to a memory cell MC1152. Each of the memory cells 730 are coupled with a plurality of bit line BLs.

With reference to FIG. 2 and FIG. 7, the word lines of FIG. 7 are disposed on a first metal layer M1 of the memory device 700 and a conducting line CL of FIG. 7 is disposed on a second metal layer M2 of the memory device 700. In detail, both the word line WL1 and the word line WL2 are disposed on the first metal layer M1 of the memory device 700.

The conducting CL includes a front node CLN1 and an end node CLN2. The front node CLN1 of the conducting line CL is coupled to the word line driver 710-1 and the end node CLN2 of the conducting line CL is coupled to the word line driver 710-2. It is noted that the front node CLN1 of the conducting CL is nearly coupled to the front node WL1N1 of the word line WL2 through the word line driver 710-1. Similarly, the end node CLN2 of the conducting line CL is nearly coupled to the end node WL1N2 of the word line WL1 through the word line driver 710-2.

With reference to FIG. 2 and FIG. 7, a plurality of bit lines BLs are disposed on a metal layer M6 of FIG. 2, the word lines of FIG. 7 are disposed on a metal layer M1 of FIG. 2, and the conducting line CL of FIG. 7 is disposed on a metal layer M7 of FIG. 2.

The conducting line CL connects a power node of the word line driver 710-1 and a power node of the word line driver 710-2 for providing a system power to the word line driver 710-1 and the word line driver 710-2.

The power transistor 720 is a CMOS transistor. The power transistor 720 includes a source terminal, a drain terminal, and a control terminal. The source terminal is coupled to a power supply of the memory device 700. The control terminal is coupled to the input terminal. In detail, the control of the power transistor 720 is configured to receive an input Vin to enable the word line driver 710. The drain terminal is coupled to the word line driver 710-1 and the word line driver 710-2. To be specific, the drain terminal of the power transistor 720 is coupled to the front node CLN1 of the conducting line CL.

The first metal layer in the memory device is the metal layer M1 in a semiconductor process and the second metal layer in the memory device is the metal layer M7 in the semiconductor process.

It is noted that, a distance of the second metal layer with respect to a plurality of transistors in the memory device is greater than a distance of the first metal layer with respect to the plurality of transistors in the memory device.

By using plurality of word line drivers disposed in the middle of the memory cells and the conducting line disposed on the second metal layer connects both the word line drivers and provides the system power to both word line drivers. Therefore, the word line WL1 may be charged from both a near end and a far end by the word line driver 710-1 and the other half of the word line, the word line WL2 may be charged by the word line driver 710-2 in the memory device, thereby a RC delay of the memory device is reduced further.

Figure 8:
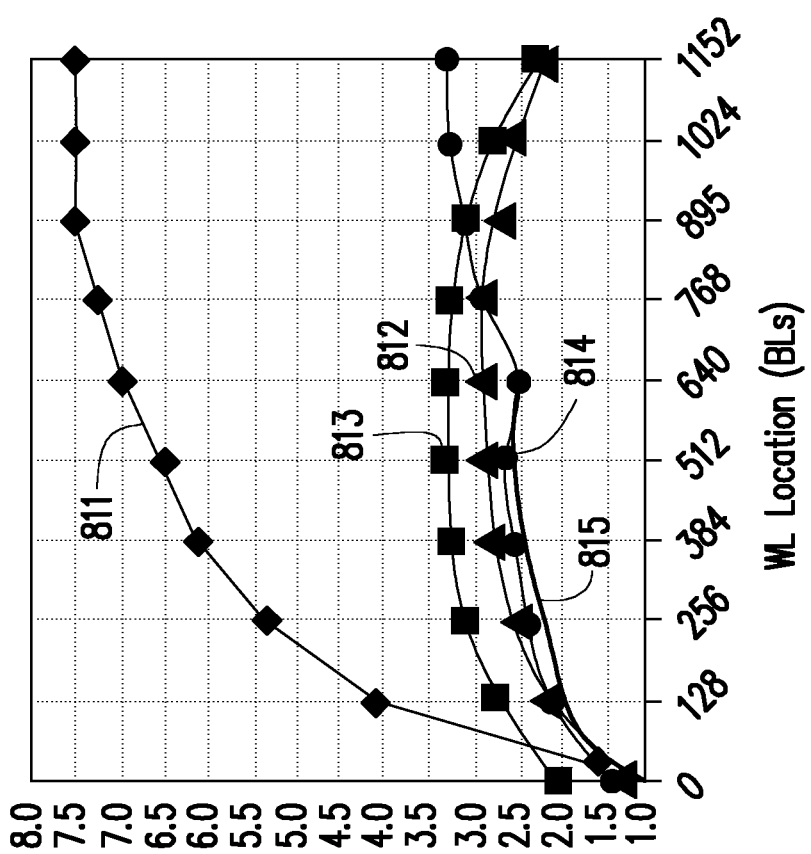
FIG. 8 illustrates a diagram illustrating a RC delay in a word line driving device of a memory device in accordance with some embodiments.

FIG. 8 illustrates a diagram illustrating RC delay in a word line driving device of a memory device in accordance with some embodiments. The horizontal axis of the diagram shown in FIG. 8 illustrates the memory cell location in a memory array of the memory device and the vertical axis of the diagram shown in FIG. 8 illustrates word line rising time. FIG. 8 shows curves 811, 812, 813, 814, and 815. The curve 811 indicates a word line driving device of the memory device without using a conducting line. The curve 812 illustrating a word line driving device of a memory device according to the exemplary embodiment shown in FIG. 1 and FIG. 3. The curve 813 illustrating a word line driving device of a memory device according to the exemplary embodiment shown in FIG. 4 and FIG. 5. The curve 814 and 815 are the curves illustrating a word line driving device of a memory device according to the exemplary embodiment shown in FIG. 6 and FIG. 7. The curve 811 indicates the rise time of the word line without using the conducting line increases the charging time due to the high RC delay in the word line in compared with the curves 812, 813, 814 and 815. It is noted that the RC delay increases as the location of memory cells correspondingly increases.

According to some embodiments, the disclosure provides a word line driving device of a memory device. The word line driving device of the memory device includes a word line, a word line driver, and a conducting line. The word line is disposed on a first metal layer. The word line is connected to a plurality of memory cells in a memory array. The word line driver is coupled to a first node of the word line. The conducting line is disposed on a second metal layer. The first node of the word line is coupled to a first node of the conducting line and a second node of the word line is coupled to a second node of the conducting line. The distance of the second metal layer with respect to a plurality of transistors in the memory device is greater than a distance of the first metal layer with respect to the plurality of transistors in the memory device.

According to some embodiments, the disclosure provides a word line driving device of a memory device. The word line driving device of the memory device includes a word line, a first word line driver, a second word line driver, and a conducting line. The word line is disposed on a first metal layer. The word line is connected to a plurality of memory cells in a memory array. The first word line driver is coupled to a first node of the word line. The second word line driver is coupled to a second node of the word line. The conducting line is disposed on a second metal layer. The conducting line connects a power node of the first word line driver and a power node of the second word line driver for providing a system power to the first word line driver and the second word line driver. The distance of the second metal layer with respect to a plurality of transistors in the memory device is greater than a distance of the first metal layer with respect to the plurality of transistors in the memory device.

According to some embodiments, the disclosure provides a word line driving device of a memory device. The word line driving device of the memory device includes a first word line, a second word line, a first word line driver, a second word line driver, and a conducting line. The first word line is disposed on a first metal layer. The first word line is disposed on a first metal layer. The first word line is connected to a first half of a plurality of memory cells in a memory array. The second word line is disposed on the first metal layer. The second word line is connected to a last half of the plurality of memory cells in the memory array. The first word line driver is coupled to a first node of the first word line. The second word line driver is coupled between a second node of the first word line and a first node of the second word line. The conducting line is disposed on a second metal layer. The conducting line connects a power node of the first word line driver and a power node of the second word line driver for providing a system power to the first word line driver and the second word line driver. The distance of the second metal layer with respect to a plurality of transistors in the memory device is greater than a distance of the first metal layer with respect to the plurality of transistors in the memory device.

The foregoing has outlined features of several embodiments at those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A word line driving device of a memory device, comprising:
   a word line, located in a first metal layer, wherein the word line is connected to a plurality of memory cells in a row of a memory array;
   a word line driver, coupled to a first node of the word line; and
   a conducting line, located in a second metal layer,
   wherein the first node of the word line is coupled to a first node of the conducting line, and a second node of the word line is coupled to a second node of the conducting line,
   wherein a distance of the second metal layer with respect to a plurality of transistors in the memory device is greater than a distance of the first metal layer with respect to the plurality of transistors in the memory device.

2. The word line driving device of claim 1, wherein the first node of the word line is coupled to a first memory cell among the plurality of memory cells, and the second node of the word line is coupled to a last memory cell among the plurality of memory cells, wherein the first memory cell is the nearest memory cell from the word line driver in the row of the memory array, and the second memory cell is the farthest memory cell from the word line driver in the row of the memory array.

3. The word line driving device of claim 2, wherein a number of the plurality of memory cells connected to the word line is 1152, the first node of the word line is coupled to the first memory cell, and the second node of the word line is coupled to a 1152-th memory cell.

4. The word line driving device of claim 1, wherein a first node of the word line is coupled to one memory cell among a first half portion of the plurality of memory cells, the second node of the word line is coupled to another memory cell among the first half portion of the plurality of memory cells.

5. The word line driving device of claim 4, wherein the first node of the first word line is coupled to a first memory cell among the plurality of memory cells, and the second node of the word line is coupled to a middle memory cell among the plurality of memory cells.

6. The word line driving device of claim 1, wherein the first metal layer of the memory device is a first metal layer in the semiconductor process, and the second metal layer of the memory device is a seventh metal layer in the semiconductor process,
   wherein a zero metal layer and a fourth metal layer in the semiconductor process are isolated metal layers.

7. The word line driving device of claim 1, wherein the memory device comprising:
   a plurality of bit lines, disposed on the plurality of memory cells in the memory array.

8. The word line driving device of claim 1, further comprising:
   a power transistor, providing a system power to the word line driver.

9. A word line driving device of a memory device, comprising:
   a word line, located in a first metal layer, wherein the word line is connected to all memory cells in a row of a memory array;
   a first word line driver, coupled to a first node of the word line;
   a second word line driver, coupled to a second node of the word line; and
   a conducting line, located in a second metal layer,
   wherein the first word line driver receives a system power through a power node of the first word line driver, the conducting line connects the power node of the first word line driver to a power node of the second word line driver for providing the system power to the second word line driver through the conducting line,
   wherein a distance of the second metal layer with respect to a plurality of transistors in the memory device is greater than a distance of the first metal layer with respect to the plurality of transistors in the memory device.

10. The word line driving device of claim 9, wherein the first node of the first word line is coupled to a first memory cell among the memory cells in the row of the memory array, and the second node of the word line is coupled to a last memory cell among the memory cells in the row of the memory array.

11. The word line driving device of claim 9, wherein the first node of the first word line is coupled to a first memory cell among the memory cells in the row of the memory array, and the second node of the word line is coupled to a middle memory cell among the memory cells in the row of the memory array.

12. The word line driving device of claim 9, wherein the first word line driver and the second word line driver drives the word line simultaneously.

13. The word line driving device of claim 9, further comprising:
    a power transistor, wherein one node of the power transistor is coupled to the conducting line, another node of the power transistor is coupled to a system voltage node, the power transistor provides the system power to the first word line driver and the second word line driver.

14. The word line driving device of claim 9, wherein the first metal layer of the memory device is the first metal layer in the semiconductor process, and the second metal layer of the memory device is a seventh metal layer in the semiconductor process,
    wherein a zero metal layer and a fourth metal layer in the semiconductor process are isolated metal layers.

15. The word line driving device of claim 9, wherein the memory device comprising:
    a plurality of bit lines, disposed on the plurality of memory cells in the row of memory cells.

16. A word line driving device of a memory device, comprising:
    a word line, located in a first metal layer, coupled to all memory cells in a row of a memory array, wherein the word line includes a first part and a second part, the first part of the word line is coupled to a plurality of first memory cells, and the second part of the word line is coupled to a plurality of second memory cells,
    a first word line driver, coupled to the first part of the word line;
    a second word line driver, coupled between the first part and the second part of the word line; and
    a conducting line, located in a second metal layer,
    wherein the first word line driver receives a system power through a power node of the first word line driver, the conducting line connects the power node of the first word line driver to a power node of the second word line driver for providing the system power to the second word line driver through the conducting line, wherein a distance of the second metal layer with respect to a plurality of transistors in the memory device is greater than a distance of the first metal layer with respect to the plurality of transistors in the memory device.

17. The word line driving device of claim 16, wherein the row of the memory array includes 1152 memory cells, the word line includes a first node, a second node, a third node and a fourth node, wherein the first part of the word line is between the first node and the second node, and the second part of the word line is between the third node and the fourth node, the first node of the word line coupled to the first memory cell in the row of the memory array, the second node of the word line coupled to the 576-th memory cell in the row of the memory array, the third node of the word line coupled to the 577-th memory cell in the row of the memory array, and the fourth node of the word line is coupled to the 1152-th memory cell in the row of the memory array.

18. The word line driving device of claim 16, further comprising:

a power transistor, wherein one node of the power transistor is coupled to the conducting line, another node of the power transistor is coupled to a system voltage node, the power transistor provides the system power to the first word line driver and the second word line driver.

19. The word line driving device of claim 16, wherein the first metal layer of the memory device is a first metal layer in the semiconductor process, and the second metal layer of the memory device is a seventh metal layer in the semiconductor process, wherein a zero metal layer and a fourth metal layer in the semiconductor process are isolated metal layers.

20. The word line driving device of claim 16, wherein the memory device comprising:

a plurality of bit lines, disposed on the plurality of memory cells in the memory array.

* * * * *